United States Patent [19]

Wright et al.

[11] Patent Number: 4,816,371
[45] Date of Patent: Mar. 28, 1989

[54] NEGATIVE-WORKING IMAGING METHOD EMPLOYING ENCAPSULATED PHOTOHARDENABLE COMPOSITIONS

[75] Inventors: Richard F. Wright, Dayton; Paul C. Adair, Springboro, both of Ohio

[73] Assignee: The Mead Corporation, Dayton, Ohio

[21] Appl. No.: 91,636

[22] Filed: Sep. 1, 1987

[51] Int. Cl.$^4$ .......................... G03C 1/40; G03C 1/00
[52] U.S. Cl. .................... 430/138; 427/221; 427/222; 428/402.2; 428/402.21; 430/200; 430/235; 430/394; 430/502
[58] Field of Search ............. 430/138, 200, 235, 394, 430/502; 428/320.6, 402.2, 402.21; 427/221, 222

[56] References Cited

U.S. PATENT DOCUMENTS

| | | | |
|---|---|---|---|
| 4,399,209 | 8/1983 | Sanders et al. | 430/138 |
| 4,440,846 | 4/1984 | Sanders et al. | 430/138 |
| 4,529,681 | 7/1985 | Usami et al. | 430/138 |
| 4,533,617 | 8/1985 | Inoue et al. | 430/138 |
| 4,551,407 | 11/1985 | Sanders et al. | 430/138 |
| 4,576,891 | 3/1986 | Adair et al. | 430/512 |
| 4,587,194 | 5/1986 | Adair et al. | 430/138 |
| 4,663,266 | 5/1987 | Adair et al. | 430/138 |

FOREIGN PATENT DOCUMENTS

| | | |
|---|---|---|
| 6260694 | 9/1985 | Japan . |
| 2113860 | 8/1983 | United Kingdom . |

Primary Examiner—Mukund J. Shah
Attorney, Agent, or Firm—Smith & Schnacke

[57] ABSTRACT

A method for forming images which comprises imagewise exposing a photosensitive material to heat while simultaneously exposing said material to non-infrared actinic radiation, said material including a support and a layer of microcapsules containing an image-forming agent and a radiation curable composition on the surface of said support; said radiation curable composition being liquid at ambient temperatures and being substantially unhardened in the areas in which said material is simultaneously exposed to said heat and radiation and being substantially hardened in the areas in which said material is not simultaneously exposed to said heat and radiation; and subjecting said microcapsules to a uniform rupturing force such that said microcapsules image-wise release said image-forming agent.

13 Claims, 3 Drawing Sheets

NEGATIVE-WORKING IMAGING METHOD EMPLOYING ENCAPSULATED PHOTOHARDENABLE COMPOSITIONS

BACKGROUND OF THE PRESENT INVENTION

The present invention relates to a method for forming images using photosensitive materials of the type described in U.S. Pat. Nos. 4,399,209 and 4,440,846.

U.S. Pat. No. 4,399,209 to The Mead Corporation describes a transfer imaging system wherein an imaging sheet comprising a support and a layer of microcapsules containing a chromogenic material and a photosensitive composition is image-wise exposed to actinic radiation. The exposed sheet is assembled with a developer sheet and the two sheets are passed together through a calendar nip whereupon the microcapsules rupture and the contents of the microcapsules are image-wise transferred to the developer sheet where the chromogenic material reacts to form a colored image. Typically, the photosensitive composition is a radiation curable composition containing an ethylenically unsaturated compound and a photoinitiator, the chromogenic material is a substantially colorless electron donating compound, and the developer is an electron acceptor. Upon image-wise exposing the imaging sheet to actinic radiation, the photosensitive composition hardens in the exposed area but remains liquid in the unexposed areas. Thus, the microcapsules in the unexposed areas remain capable of rupturing and releasing the chromogenic material upon subjecting the imaging sheet to a uniform rupturing force whereas the microcapsules in the exposed areas do not.

Related U.S. application Ser. No. 339,917 filed Jan. 18, 1982, corresponding to U.K. Pat. No. 2,113,860, describes an imaging sheet and method useful in the preparation of full color images. The application discloses both ultraviolet sensitive and visible light sensitive imaging sheets. The most typical imaging sheet prepared in accordance with the teachings of this application includes a layer containing three sets of microcapsule homogeneously distributed on the surface of the support. Each set of microcapsules contains a different radiation curable composition which is principally sensitive to a different band of actinic radiation. In accordance with one embodiment, the three bands of radiation are in the 300-400 nm range. See U.S. Pat. No. 4,576,891. In accordance with another embodiment, the three distinct bands of radiation are red, green and blue light. Exposure of the three sets of microcapsules controls the release of cyan, magenta and yellow image-forming agents. Upon subjecting the exposed imaging sheet to a uniform rupturing force in contact with the developer sheet, the cyan, magenta and yellow image-forming agents are image-wise transferred to the developer sheet where a full color image is formed.

U.S. application Ser. No. 944,305, filed Dec. 18, 1986 corresponding to Published European Application No. 0233587 discloses a panchromatic imaging material.

Various methods have been proposed for image-wise exposing the aforementioned imaging sheets, and more particularly, imaging sheets useful in the production of full color images. The simplest approach involves the preparation of color separations which are assembled with the imaging sheet for exposure to three distinct bands of radiation. Another method which has been proposed relies the use of liquid crystal or light valve technology. The liquid crystal selectively transmits light to the surface of the imaging sheet for exposure. Thus, by controlling the liquid crystal, the liquid crystal functions analogous to a color separation.

In each of the aforementioned methods, the imaging sheet is exposed by selectively transmitting radiation to the surface of the imaging sheet. The amount of chromogenic material released from a predetermined microcapsule is a function of the amount of exposure which the microcapsule receive. Microcapsules receiving a high amount of exposure (fully exposed microcapsules) do not release the chromogenic material. Microcapsules receiving a low amount of exposure or no exposure (unexposed microcapsules) release the chromogenic material fully. Microcapsules receiving an intermediate degree of exposure may release the chromogenic material in an intermediate amount.

Japanese Patent Publication No. 62-60694 discloses a methods of imaging wherein an imaging sheet analogous to that described in U.S. Pat. No. 4,399,209 is image-wise heated and simultaneously uniformly exposed to light or ultraviolet radiation to form images. The internal phase of the microcapsules includes a radiation sensitive composition having a temperature (e.g., a glass transition temperature) above which the composition must be heated before it reacts efficiently in the presence of light. In the absence of heat, the composition reacts very slowly. Accordingly, by image-wise heating this imaging sheet while simultaneously exposing the imaging sheet to light, images can be formed. In the heat-exposed areas, the radiation sensitive composition hardens such that the microcapsule does not rupture and release the image-forming agent upon subjecting the microcapsule to a uniform rupturing force. In the heatunexposed areas, light does not substantially alter the properties of the radiation sensitive composition and, consequently, the microcapsules remain capable of releasing the image-forming agent. This method is advantageous because images can be formed in the imaging sheet through the use of a thermal printhead instead of optical means such as color separations, liquid crystals, etc.

Definitions

The term "microcapsule" includes both microcapsules having a discrete wall as well as microcapsules formed by dispersing droplets of a radiation curable composition in a binder.

SUMMARY OF THE INVENTION

In accordance with the present invention, images are formed in an imaging sheet of the type described in U.S. Pat. No. 4,399,209 and U.S. application Ser. No. 339,917 by image-wise exposing the imaging sheet to heat while simultaneously exposing the imaging sheet to non-infrared actinic radiation.

In accordance with the present invention as contrasted with the method described in Japanese Published Application 62-60694, heat reduces rather than increases the reactivity of the photosensitive composition. In accordance with the method described in Japanese Publication, the internal phase of the microcapsule is solid at room temperature and must be heated above its glass transition temperature in order to react efficiently to light. In the present invention, however, the radiation sensitive composition is essentially liquid at room temperature. Consequently, it is not necessary to heat the composition to induce the reaction to light. It has been found, however, that heat inhibits photohardening of liquid room temperature photocurable compositions. While the basis of heat inhibition is not entirely clear, it is believed that heat may accelerate termination of the free radical polymerization reaction due to the higher permeability of the capsule walls to oxygen. Thus, whereas the process of the Japanese Application is positive working in the sense that images are formed in the unheated areas, the process of the present invention is negative working in that images are formed in the heated areas.

Accordingly, the present invention provides a method for forming images which comprises imagewise exposing a photosensitve material to heat while simultaneously uniformly exposing said material to non-infrared actinic radiation, said material including a support and a layer of microcapsules on the surface of said support, said microcapsules containing an image-forming agent and a radiation curable composition; said radiation curable composition being liquid at ambient temperatures and being substantially unhardened in the areas in which said material is exposed to said heat and being substantially hardened in the areas in which said material is not exposed to heat; and subjecting said microcapsules to a uniform rupturing force such that said microcapsules image-release said image-forming agent.

In accordance with the preferred embodiments of the present invention, the image-forming agent is a color precursor which reacts with a developer to form a visible image. The developer may be present on the surface of the imaging sheet as described in U.S. Pat. No. 4,440,846, but it is preferably on the surface of a separate image-receiving sheet as described in U.S. Pat. No. 4,399,209.

In accordance with a preferred embodiment of the present invention, the method is useful in forming multi-colored images. In accordance with this embodiment, the layer of microcapsules includes a plurality of different sets of microcapsules which are homogeneously distributed on the surface of the support. Each set of microcapsules contains a different image-forming agent and a different radiation curable composition such that each set of microcapsules is primarily sensitive to a different band of actinic radiation.

To form full color images, three sets of microcapsules are present on the surface of the support. Each set respectively contains a cyan, magenta or yellow image-forming agent. The method includes the steps of imagewise exposing the material to heat in a first pattern while simultaneously exposing the material to a first band of actinic radiation, image-wise exposing the material to heat in a second pattern while simultaneously exposing the material to a second band of actinic radiation and image-wise exposing the material to heat in a third pattern while simultaneously exposing said material to a third band of actinic radiation.

To develop the images, the microcapsules are subjected to a uniform rupturing force. The uniform rupturing force may be pressure, abrasion or a force such as heat (see U.S. Pat. No. 4,663,266).

DETAILED DESCRIPTION OF THE INVENTION

The imaging materials of the present invention can be prepared by following the teachings of U.S. Pat. No. 4,399,209. Visible light-sensitive compositions useful in the present invention are described in Published European Application No. 0233587. A preferred developer sheet for use in the present invention carries a glossable thermoplastic developer material as described in U.S. application Ser. No. 905,727, filed Sept. 9, 1986.

The method of the present invention is illustrated more clearly by reference to the accompanying figures.

Figure 1:
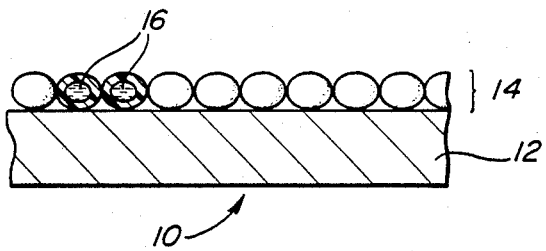

FIG. 1 illustrates an imaging sheet 10 comprising a support 12 coated with a layer of microcapsules 14. The microcapsules contain a liquid internal phase 16 containing an image-forming agent and a radiation curable composition.

Figure 2:
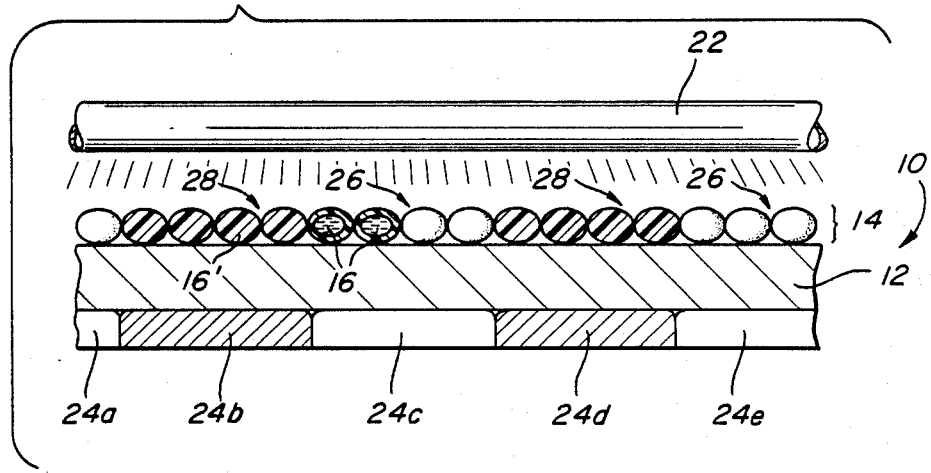

Exposure of the imaging sheet 10 is illustrated in FIG. 2 wherein a source of non-infrared actinic radiation 22 is positioned above the layer of microcapsules 14. An array of heating elements 24a-e is positioned below the sheet 10. Elements 24a, 24c, and 24e are activated such that they heat the overlying areas 26 of the photosensitive material 10. In the heat-exposed areas 26, the internal phase 16 of the microcapsules does not polymerize in the presence of the radiation emitted by source 22. Polymerization is inhibited by the heat generated in areas 26. Heating elements 24b and 24d, on the other hand, are not activated. Thus, the temperature of the photosensitive material 10 is not elevated in areas 28 immediately above these elements. In areas 28, the internal phase reacts to the radiation emitted by source 22 and is hardened as indicated at 16'.

Figure 3:
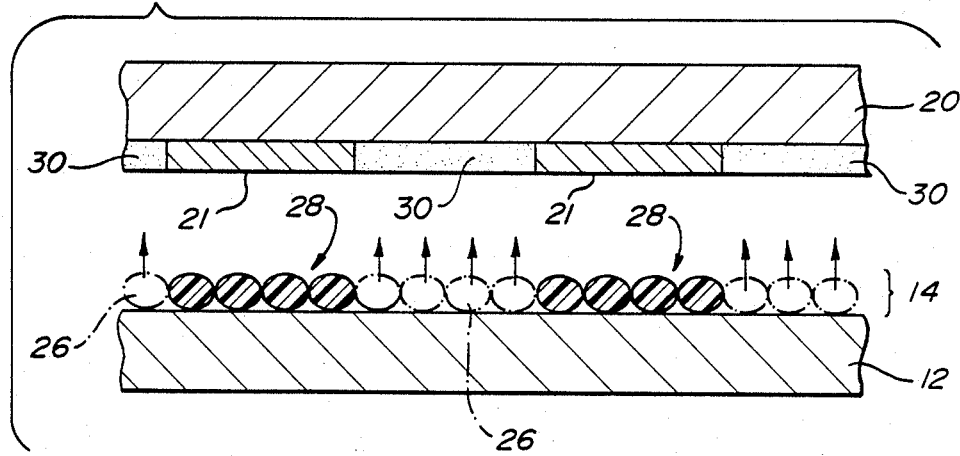

Image formation or development is shown in FIG. 3 wherein the exposed imaging sheet 10 is placed with its microcapsule layer 14 in face-to-face contact with a developer sheet 19. The developer sheet 19 includes a support 20 and a layer of developer material 21. The imaging sheet 10 is subjected to a uniform rupturing force in contact with the developer sheet 19. In the heated areas 26, the microcapsules rupture and produce an image 30 in the developer layer 21. In the unheated areas 28, on the other hand, the microcapsules do not rupture and, consequently, there is no coloration of the developer layer 21.

If the image-forming agent is a colored dye or pigment, images can be formed directly by transfer to a receiving sheet such as plain paper. The developer layer 21 is not necessary. Dyes and pigments, however, interfere with absorption of radiation by the radiation curable composition and reduce sensitivity.

Figure 4:
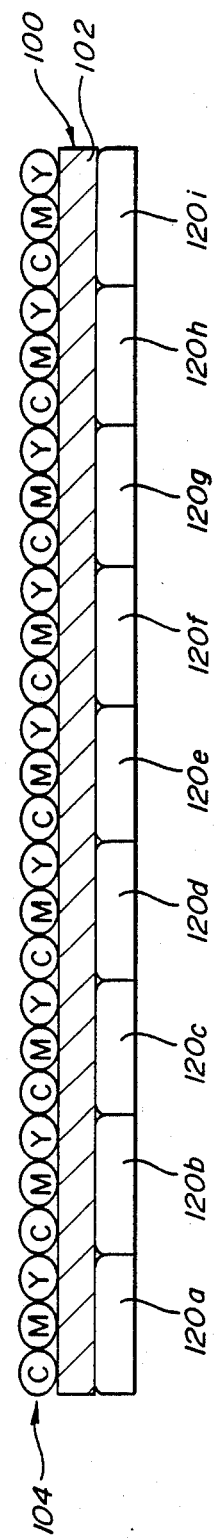

The formation of full colored images is illustrated in more detail in FIG. 4.

FIG. 4 illustrates a photosensitive material 100 comprising a support 102 having a layer of microcapsules 104 on the surface thereof. The microcapsules are schematically illustrated in FIG. 4. Each microcapsule contains a radiation curable composition and an image-forming agent. Each microcapsule is labeled with the color produced by the image-forming agent contained therein. Microcapsules containing a cyan image-forming agent are designated C; microcapsules containing a magenta imaging forming agent are designated M; and microcapsules containing a yellow image-forming agent are designated Y. As explained above, each of these sets of microcapsules is primarily sensitive to a distinct band of radiation such that the microcapsules containing the cyan image-forming agent are essentially insensitive to the radiation to which the microcapsules containing the magenta and the yellow image-forming agents are sensitive. Similarly, the microcapsules containing the magenta image-forming agent contain a radiation curable composition which is essentially insensitive to the radiation to which the microcapsules containing the cyan and yellow imaging-forming agents are sensitive. Preferably, the microcapsules containing the cyan image-forming agent are sensitive to red light, the microcapsules containing the magenta image-forming agent are sensitive to green light and the microcapsules containing the yellow image-forming sensitive agent are sensitive to blue light. However, other distinct bands of radiation can be used such as three distinct bands in the 300–450 nm region such as 340–360 380–400, and 460–480 nm as shown in U.S. Pat. No. 4,576,891.

An array of heating elements 120a–i is shown under the photosensitive material 100.

Figure 4A:
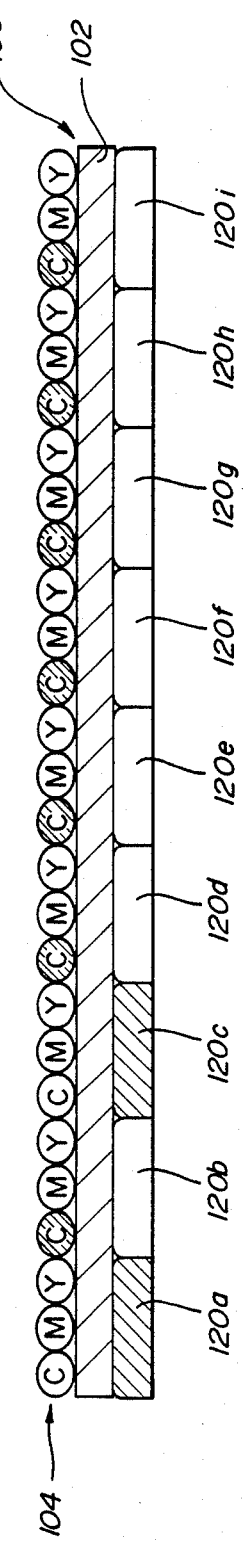

To form full color images in accordance with the present invention, the photosensitive material 100 is uniformly exposed to a first band of radiation such as red light to which the cyan producing microcapsules (C) are sensitive. Simultaneously, heating elements 120 are activated in response to a red imaging signal in those areas in which a cyan image is desired. Stated differently, the heating elements 120 are activated in areas corresponding to the non-transmitting areas of a red color separation. In FIG. 4A, elements 120a and 120c are activated whereas the balance of the elements are not. As a result, the cyan producing microcapsules in the areas corresponding to heating elements 120a and 120c remain capable of releasing the cyan image-forming agent whereas the balance of the cyan capsules are hardened by the first radiation and are inactive. The microcapsules have been shaded to illustrate this.

Figure 4B:
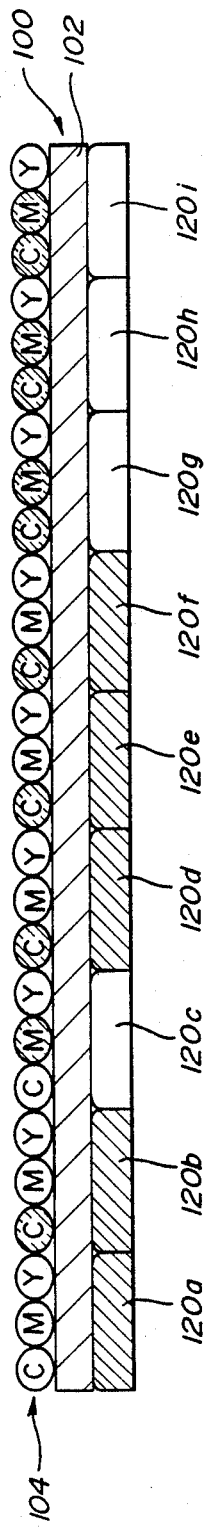

Subsequently, the imaging sheet is exposed to a second band of radiation or green light. Simultaneously, heating elements 120 are activated in response to a green imaging signal in the areas in which it is desired to release the magenta image-forming agent. Thus, heating elements 120 are activated in areas corresponding to the non-transmitting portions of a green color separation. In FIG. 4B, elements 120a, 120b, 120d, 120e, and 120f are activated. In these areas the magenta capsules are not polymerized by the second band of radiation whereas the balance of the magenta producing microcapsules are hardened as indicated by the shading.

Figure 4C:
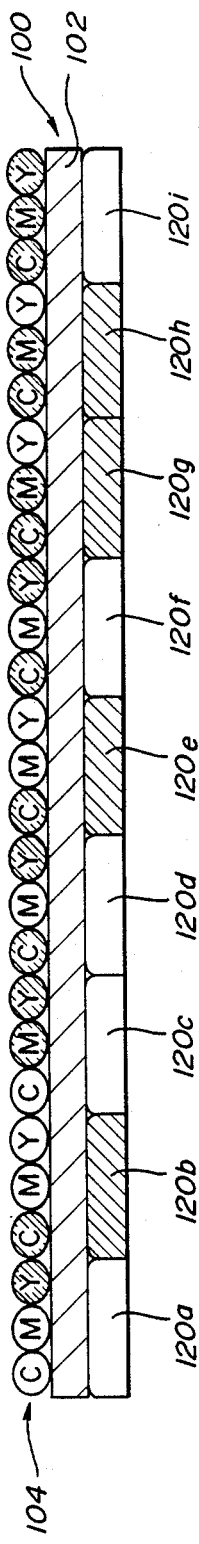

Finally, as shown in FIG. 4C, the photosensitive material 100 is exposed to a third band of radiation or blue light and heating elements 120 are activated in areas in which release of the yellow image-forming agent is desired or in areas corresponding to the non-transmitting portions of a blue color separation. In FIG. 4C, elements 120b, 120g, 120h, and 120e are activated. In these areas, the yellow capsules retain their ability to rupture and release the imaging forming agent whereas the balance of the yellow capsules are hardened.

Figure 4D:
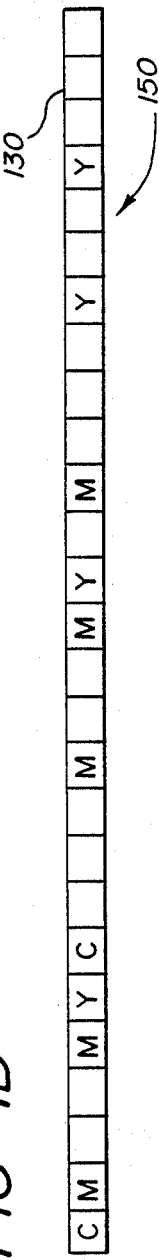

When the exposed imaging sheet of FIG. 4C is developed, that image is formed as shown in FIG. 4D in the developer layer 130 of developer sheet 150. The unhardened capsules rupture and release the image-forming agents.

The present invention is illustrated in more detail by the following non-limiting example.

Urea-formaldehyde capsules were produced with the following photosensitive internal phase:

| | |
|---|---|
| 35 g | trimethylolpropane triacrylate |
| 15 | DPHPA |
| 1 | N,N,2,4,6-pentamethyl aniline |
| 1 | 2-mercaptobenzoxazole |
| 6 | HD5430 (Hilton-Davis) dye precursor |
| 0.15 | 9-(4'isopropylcinnamoyl)-1,2,4,5-tetrahydro- |

-continued

| | |
|---|---|
| | 3-H, 6H, 10H[1]-benzopyrano[9,9a,1-gh] quinolazine-10-one |

These capsules were coated on 1 mil PET at 10 g/m² from a mixture of 95% capsules, 4% Vinol 205, 1% Triton X100 (dry wt.) at 20% solids.

Upon drying, the resultant sheets were placed on a PTC melting point meter, Model 304.5 (Pacific Transducer Corp.). This apparatus consists of a metal bar which continuously varies in temperature along the surface. One F15T8.CW bulb placed at a distance of 48 cm was used to expose the sample for 8 seconds.

The capsule sheet was then pressure-developed against a sheet containing HRJ-4542 developer (Schnectady Chemicals) on 80lb Black and White Dull paper (Mead). After heating the developer sheet to 150° C. for one minute to coalesce the layer, the densities were read with a MacBeth densitometer (red filter) at points along the image. Densities and the temperature of the bar at corresponding points are listed in the table below:

| Temperature | Density |
|---|---|
| 35 | 0.09 |
| 40 | 0.09 |
| 45 | 0.09 |
| 52 | 0.20 |
| 62 | 0.22 |
| 70 | 0.26 |
| 76 | 0.42 |
| 85 | 0.55 |
| 95 | 0.62 |

Thus, it was shown that differential backside heating of a sheet containing photopolymerizable microapsules, concurrent with actinic exposure, allows for differential polymerization and thereby differential densities. The capsules over the warmer areas did not polymerize to the same degree as those over the cooler areas. This process also allows the density to be varied continuously by variation of the temperature of heating.

Having described the invention in detail and by reference to preferred embodiments thereof, it will be apparent that modifications and variations are possible without departing from the scope of the invention defined in the appended claims.

What is claimed is:

1. A method for forming images which comprises image-wise exposing a photosensitive material to heat while simultaneously exposing said material to non-infrared actinic radiation, said material including a support and a layer of microcapsules containing an image-forming agent and a radiation curable composition on the surface of said support, said radiation curable composition being liquid at ambient temperatures; said photosensitive material being heated to a temperature such that said radiation curable composition is substantially unhardened in the areas in which said material is simultaneously exposed to said heat and said radiation and is substantially hardened in the areas in which said material is not simultaneously exposed to heat and said radiation; and subjecting said microcapsules to a uniform rupturing force such that said microcapsules image-wise release said image-forming agent.

2. The method of claim 1, wherein said image-forming agent is substantially colorless electron donating color precursor and said color precursor reacts with a developer to form a visible image.

3. The method of claim 2 wherein said developer material is present as a layer on an image-receiving sheet.

4. The method of claim 3 wherein said non-infrared actinic radiation is visible light or ultraviolet radiation.

5. The method of claim 4 wherein said method is useful in forming full color images and said layer of microcapsules includes at least a first, a second and a third set of microcapsules distributed on the surface of said support; said first, second and third sets of microcapsules respectively containing first, second, and third radiation curable compositions and first, second and third image-forming agents; said compositions being primarily sensitive to different bands of said actinic radiation; and said step of simultaneously image-wise exposing said material to heat and radiation includes the steps of image-wise exposing said material to heat in a first pattern while simultaneously exposing said material to a first band of said radiation, image-wise exposing said material to heat in a second pattern while simultaneously exposing said material to a second band of radiation, and image-wise exposing said material to heat in a third pattern while simultaneously exposing said material to a third band of said radiation.

6. The method of claim 5 wherein said first, second and third image-forming agents are respectively cyan, magenta, and yellow dye precursors.

7. The method of claim 6 wherein said first, second and third bands of radiation are respectively red, green and blue light.

8. The method of claim 6 wherein said first, second and third bands of radiation are three distinct bands of ultraviolet radiation or blue light.

9. The method of claim 4 wherein said layer of microcapsules includes a plurality of sets of microcapsules distributed on the surface of said support, each of said sets of microcapsules containing a different image-forming agent and a different radiation curable composition such that each of said sets of microcapsules is primarily sensitive to a different band of said radiation.

10. The method of claim 1 wherein said uniform rupturing force is pressure.

11. The method of claim 1 wherein said radiation curable composition is a free radical polymerizable composition.

12. The method of claim 11 wherein said radiation curable composition includes an ethylenically unsaturated compound.

13. The method of claim 1 wherein said microcapsules have discrete walls.

* * * * *